United States Patent
Choi et al.

(10) Patent No.: US 11,875,840 B2
(45) Date of Patent: Jan. 16, 2024

(54) SEMICONDUCTOR DEVICE PERFORMING IN-MEMORY PROCESSING AND OPERATION METHOD THEREOF

(71) Applicants: SK hynix Inc., Icheon (KR); Seoul National University R&DB Foundation, Seoul (KR)

(72) Inventors: Hae Rang Choi, Icheon (KR); Sungjoo Yoo, Seoul (KR)

(73) Assignees: SK hynix Inc., Icheon (KR); Seoul National University R&DB Foundation, Seoul (KR)

( * ) Notice: Subject to any disclaimer, the term of this patent is extended or adjusted under 35 U.S.C. 154(b) by 163 days.

(21) Appl. No.: 17/527,908

(22) Filed: Nov. 16, 2021

(65) Prior Publication Data

US 2022/0343968 A1    Oct. 27, 2022

(30) Foreign Application Priority Data

Apr. 15, 2021  (KR) .......................... 10-2021-0049460

(51) Int. Cl.

| | | |
|---|---|---|
| G11C 11/54 | (2006.01) | |
| G11C 11/4091 | (2006.01) | |
| G06F 7/50 | (2006.01) | |
| G11C 11/4096 | (2006.01) | |
| G11C 11/4094 | (2006.01) | |
| G11C 7/10 | (2006.01) | |
| G11C 11/4063 | (2006.01) | |

(52) U.S. Cl.
CPC ............ *G11C 11/4091* (2013.01); *G06F 7/50* (2013.01); *G11C 7/1051* (2013.01); *G11C 11/4063* (2013.01); *G11C 11/4094* (2013.01); *G11C 11/4096* (2013.01); *G11C 11/54* (2013.01); *G11C 7/1006* (2013.01)

(58) Field of Classification Search
CPC .............. G11C 11/4091; G11C 7/1051; G11C 11/4063; G11C 11/4094; G11C 11/4096; G11C 11/54; G11C 7/1006
See application file for complete search history.

(56) References Cited

U.S. PATENT DOCUMENTS

| | | | |
|---|---|---|---|
| 9,697,877 B2 * | 7/2017 | Shanbhag | ................ G11C 8/08 |
| 2019/0042199 A1 | 2/2019 | Sumbul et al. | |
| 2019/0164591 A1* | 5/2019 | Takahashi | ........... G11C 11/4076 |

(Continued)

FOREIGN PATENT DOCUMENTS

KR    10-2018-0046846 A    5/2018

OTHER PUBLICATIONS

KR101991041B1 , 2019 (Year: 2019).*

(Continued)

*Primary Examiner* — Mushfique Siddique (57) ABSTRACT

A semiconductor device includes a cell circuit including a plurality of memory arrays, and a control circuit configured to control the cell circuit. A memory array of the plurality of memory arrays has a plurality of sub-arrays including a first sub-array and a second sub array, and an array connecting circuit configured to connect bit lines of the first sub-array to respective corresponding bit lines of the second sub-array according to a copy signal. The semiconductor device may further include a partial sum circuit configured to perform charge sharing between a plurality of bit lines of the first sub-array.

11 Claims, 8 Drawing Sheets

(56) References Cited

U.S. PATENT DOCUMENTS

| | | | |
|---|---|---|---|
| 2020/0150864 A1* | 5/2020 | Lea | G11C 11/4076 |
| 2021/0089893 A1* | 3/2021 | Choi | G06N 3/048 |
| 2021/0193196 A1* | 6/2021 | Augustine | G11C 11/419 |
| 2021/0350846 A1* | 11/2021 | Rios | G11C 7/1075 |

OTHER PUBLICATIONS

V. Seshadri et al., "Ambit: In-Memory Accelerator for Bulk Bitwise Operations Using Commodity DRAM Technology," 2017 50th Annual IEEE/ACM International Symposium on Microarchitecture (MICRO), Boston, MA, USA, 2017, pp. 273-287.

S. Li et al., "DRISA: A DRAM-based Reconfigurable In-Situ Accelerator," 2017 50th Annual IEEE/ACM International Symposium on Microarchitecture (MICRO), Boston, MA, USA, 2017, pp. 288-301.

Y.-H. Chen et al., "Eyeriss: An energy-efficient reconfigurable accelerator for deep convolutional neural networks," IEEE Journal of Solid-State Circuits, vol. 52, No. 1, pp. 127-138, 2017.

T. Chen et al., "Diannao: A small-footprint high-throughput accelerator for ubiquitous machine-learning," in ACM Sigplan Notices, vol. 49, pp. 269-284, ACM, 2014.

Y. Chen et al., "Dadiannao: A machine-learning supercomputer," in Proceedings of the 47th Annual IEEE/ACM International Symposium on Microarchitecture, pp. 609-622, IEEE Computer Society, 2014.

S. Han et al., "Eie: efficient inference engine on compressed deep neural network," in 2016 ACM/IEEE 43rd Annual International Symposium on Computer Architecture (ISCA), pp. 243-254, IEEE, 2016.

S. K. Gonugondla et al., "Energy-efficient deep in-memory architecture for nand flash memories," in 2018 IEEE International Symposium on Circuits and Systems (ISCAS), pp. 1-5, IEEE, 2018.

S. Li, et al., "Scope: A stochastic computing engine for dram-based in-situ ccelerator.," in MICRO, pp. 696-709, 2018.

M. Horowitz, "1.1 Computing's energy problem (and what we can do about it)," in Proc. IEEE Int. Solid-State Circuits Conf. Dig. of Technical Papers (ISSCC), San Francisco, CA, USA, 2014, pp. 10-14.

"8Gb DDR4 SDRAM," SK Hynix Inc., Icheon, Korea, Accessed: Jul. 18. 2019. [Online]. Available: https://www.skhynix.com/products.view.do?vseq=2658&cseq=73.

Yang, JJ et al., "Memristive devices for computing", Nat Nanotechnol. Jan. 2013;8(1):13-24. doi: 10.1038/nnano.2012.240. PMID: 23269430. https://www.nature.com/articles/nnano.2012.240.

* cited by examiner

SEMICONDUCTOR DEVICE PERFORMING IN-MEMORY PROCESSING AND OPERATION METHOD THEREOF

CROSS-REFERENCE TO RELATED APPLICATION

The present application claims priority under 35 U.S.C. § 119(a) to Korean Patent Application No. 10-2021-0049460, filed on Apr. 15, 2021, which is incorporated herein by reference in its entirety.

BACKGROUND

1. Technical Field

Various embodiments generally relate to a semiconductor device performing in-memory processing and an operation method thereof.

2. Related Art

In-memory processing or computation in memory (CIM) is a technology for reducing data transfer between a memory device and a chip outside of the memory device by performing a computation operation inside the memory device.

In general, by reducing data transfer to and from the memory device, power consumption and processing time can be reduced.

In the conventional semiconductor device disclosed in the article 「V. Seshadri et al., "Ambit: In-Memory Accelerator for Bulk Bitwise Operations Using Commodity DRAM Technology," 2017 50th Annual IEEE/ACM International Symposium on Microarchitecture (MICRO), Boston, Mass., USA, 2017, pp. 273-287.」, operations that can be performed in a memory device are limited to AND and OR operations, and in the conventional semiconductor device disclosed in the article 「S. Li, D. Niu, K. T. Malladi, H. Zheng, B. Brennan and Y. Xie, "DRISA: A DRAM-based Reconfigurable In-Situ Accelerator," 2017 50th Annual IEEE/ACM International Symposium on Microarchitecture (MICRO), Boston, Mass., USA, 2017, pp. 288-301.」, a gate logic circuit having a large area must be added to the memory device, which limits applications thereof. A need exists for a memory device that can perform more than just AND and OR operations without requiring the addition of a gate logic circuit having a large area to the memory device.

SUMMARY

In accordance with an embodiment of the present disclosure, a semiconductor device may include a cell circuit including a plurality of memory arrays; and a control circuit configured to control the cell circuit, wherein a memory array of the plurality of memory arrays has a plurality of sub-arrays having a first sub-array and a second sub array; and an array connecting circuit configured to connect bit lines of the first sub-array to corresponding bit lines of the second sub-array, respectively, according to a copy signal.

In accordance with an embodiment of the present disclosure, an operation method of a semiconductor device may include reading data from a first memory cell of a first sub-array onto a first bit line connected to the first memory cell; connecting the first bit line to a second bit line of a second sub-array; performing an equalization operation using a second sense amplifier to set a value of a third bit line according to a value of the data on the second bit line; performing a precharge operation using the first sense amplifier while the second sense amplifier is turned off; and performing a write operation according to the value of the third bit line using the second sense amplifier while the first sense amplifier is turned off.

In accordance with an embodiment of the present disclosure, an operation method of a semiconductor device may include performing a read operation on a plurality of memory cells of a first sub-array; connecting a plurality of bit lines connected to the plurality of memory cells in common; and amplifying a voltage of the plurality of bit lines by activating a plurality of sense amplifiers connected to the plurality of bit lines.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate various embodiments, and explain various principles and advantages of those embodiments.

DETAILED DESCRIPTION

The following detailed description references the accompanying figures in describing illustrative embodiments consistent with this disclosure. The embodiments are provided for illustrative purposes and are not exhaustive. Additional embodiments not explicitly illustrated or described are possible. Further, modifications can be made to the presented embodiments within the scope of teachings of the present disclosure. The detailed description is not meant to limit this disclosure. Rather, the scope of the present disclosure is defined in accordance with claims and equivalents thereof. Also, throughout the specification, reference to "an embodiment" or the like is not necessarily to only one embodiment, and different references to any such phrase are not necessarily to the same embodiment(s).

Figure 1:
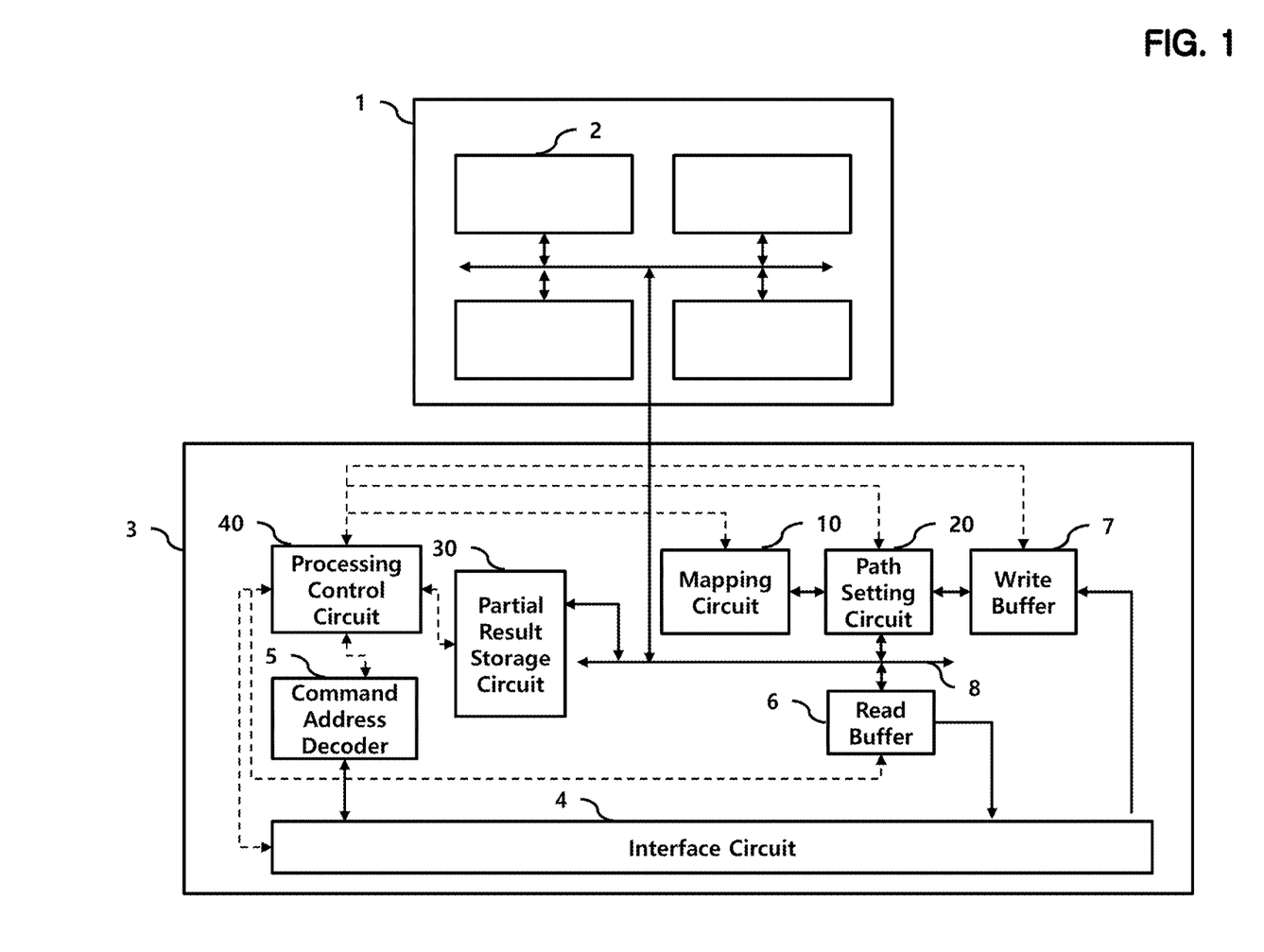
FIG. 1 illustrates a semiconductor device according to an embodiment of the present disclosure.

FIG. 1 illustrates a semiconductor device according to an embodiment of the present disclosure.

The semiconductor device includes a cell circuit 1 including a plurality of memory arrays 2 and a control circuit 3.

In the present embodiment, the memory array 2 corresponds to a bank of a dynamic random access memory (DRAM) device, but embodiments are not limited thereto.

The memory array 2 may include a plurality of sub-arrays, which will be described in detail with reference to FIG. 2 below.

The control circuit 3 includes an interface circuit 4 for exchanging data, addresses, and commands with another device, a command address decoder 5 for decoding commands and addresses, a read buffer 6 for storing read data, a write buffer 7 for storing write data, and a data bus 8.

Since these elements are also used in conventional memory devices, detailed description thereof will be omitted.

The control circuit 3 further includes a mapping circuit 10, a path setting circuit 20, a partial result storage circuit 30, and a processing control circuit 40.

These can be used to perform a processing operation using the memory array 2.

The mapping circuit 10 maps data stored in the write buffer 7 to rows of the memory array 2.

Data stored in the write buffer 7 may correspond to a two-dimensional matrix form.

In this case, in order to perform a processing operation, the mapping circuit 10 may map a row data corresponding to a row of the two-dimensional matrix to a row of the memory array 2 as it is, or map column data corresponding to a column of the two-dimensional matrix to a row of the memory array 2 by transposing the column data.

The path setting circuit 20 transfers data from the mapping circuit 10 or data from the write buffer 7 to the data bus 8 according to an operation mode.

The path setting circuit 20 may also transfer data from the write buffer 7 to the mapping circuit 10 according to an operation mode.

The partial result storage circuit 30 may be used to perform a processing operation on vector data larger than data that can be stored in one row of the memory array 2.

For example, when the size of one row is 1024 bits and the number of elements of the vector data exceeds 1024, the vector data may be divided into multiple pieces and stored in the partial result storage circuit 30.

For example, the partial result storage circuit 30 may temporarily store a result of a partial sum operation as described below.

The processing control circuit 40 may control overall operations necessary for performing a processing operation inside the semiconductor device.

The processing control circuit 40 may control the interface circuit 4, the command address decoder 5, the read buffer 6, and the write buffer 7 in order to perform read and write operations required for a processing operation.

Also, the processing control circuit 40 may control the mapping circuit 10, the path setting circuit 20, and the partial result storage circuit 30.

Figure 2:
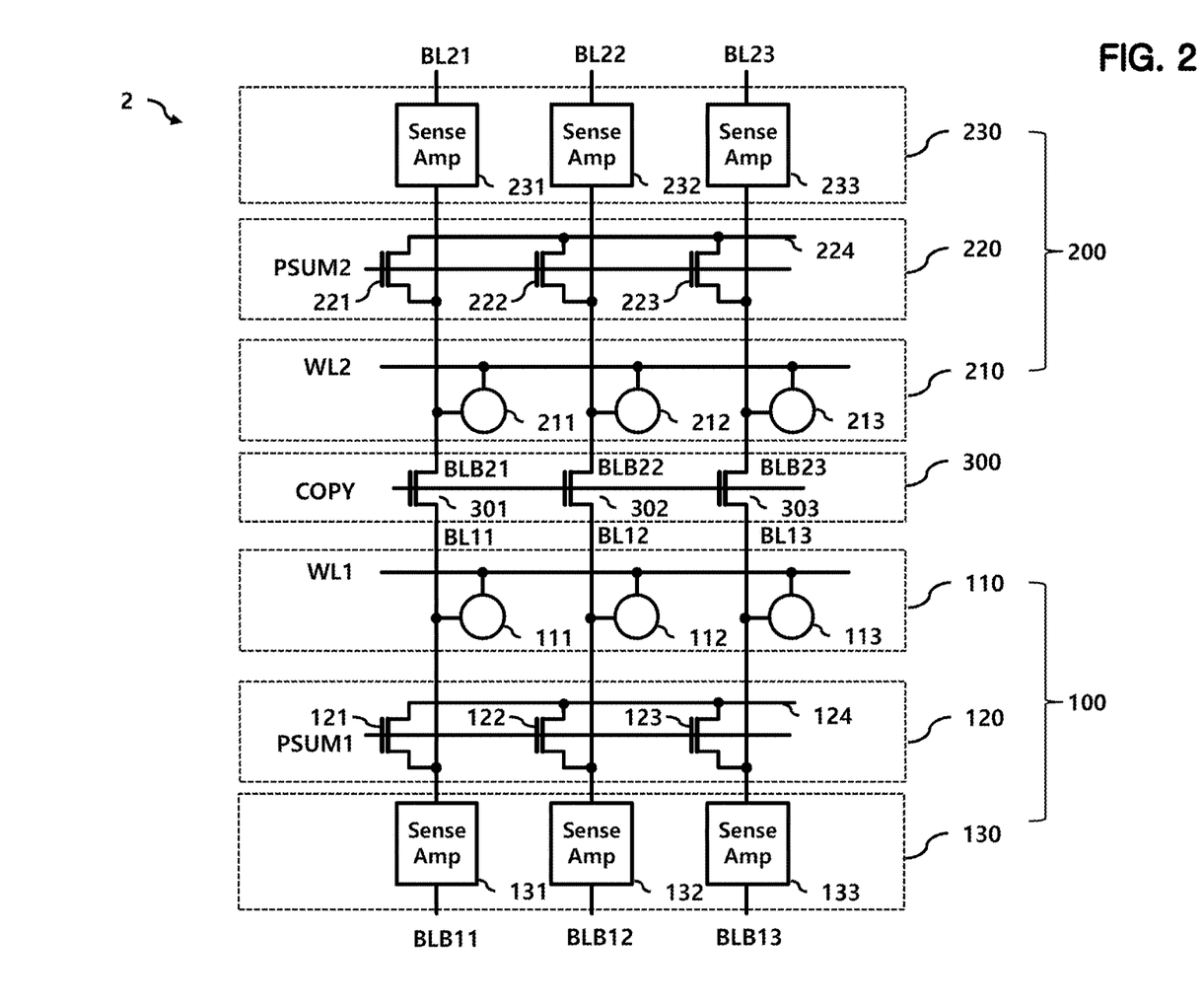
FIG. 2 illustrates a structure of a cell array according to an embodiment of the present disclosure.

FIG. 2 illustrates structure of a memory array 2.

The memory array 2 includes a plurality of sub-arrays 100 and 200 and an array connecting circuit 300.

Although only two sub-arrays 100 and 200 are illustrated in FIG. 2, the number of sub-arrays is not limited thereto.

The sub-arrays 100 and 200 are arranged in a column direction and may be connected to each other through the array connection circuit 300.

Hereinafter, the sub-array 100 may be referred to as a first sub-array 100 and the sub-array 200 may be referred to as a second sub-array 200.

The first sub-array 100 includes a first cell array 110 including a plurality of memory cells 111, 112, and 113 connected between a word line WL1 and respective bit lines BL1, BL2, and BL3.

Although one word line WL1 and three bit lines BL11, BL12, and BL13 are illustrated in the drawing, the number of word lines and bit lines is not limited thereto.

The first sub-array 100 includes a first partial sum generating circuit 120 connecting a plurality of bit lines included in the first cell array 110 to a first common connection line 124 according to a first partial sum generating signal PSUM1.

In the present embodiment, the first partial sum generating circuit 120 includes a plurality of switches 121, 122, and 123 which are NMOS transistors, respectively.

The first sub-array 100 includes a first sense amplifier array 130 including a plurality of sense amplifiers 131, 132, and 133 connected to a plurality of bit lines.

The sense amplifier 131 is connected between bit lines BL11 and BLB11, the sense amplifier 132 is connected between bit lines BL12 and BLB12, and the sense amplifier 133 is connected between bit lines BL13 and BLB13. In embodiments, the sense amplifiers 131, 132, and 133 may also be connected to, for example, the data bus 8 of FIG. 1, to read data from and write data to the first sub-array 100.

The second sub-array 200 has substantially the same configuration as the first sub-array 100.

The second sub-array 200 includes a second cell array 210, a second partial sum generating circuit 220, and a second sense amplifier array 230 which correspond to the first cell array 110, the first partial sum generating circuit 120, and the first sense amplifier array 130, respectively.

The second cell array 210 includes a plurality of memory cells 211, 212, and 213 connected between the word line WL2 and respective bit lines BLB21, BLB22, and BLB23. Although one word line WL2 and three bit lines BLB21, BLB22, and BLB23 are illustrated in the drawing, the number of word lines and bit lines is not limited thereto.

The second partial sum generating circuit 220 commonly connects a plurality of bit lines included in the second cell array 210 to the second common connection line 224 according to the second partial sum generating signal PSUM2.

In the present embodiment, the second partial sum generating circuit 220 includes a plurality of switches 221, 222, and 223, each of which is an NMOS transistor.

The second sense amplifier array 230 includes a plurality of sense amplifiers 231, 232, and 233 connected to a plurality of bit lines.

The sense amplifier 231 is connected between bit lines BL21 and BLB21, the sense amplifier 232 is connected between bit lines BL22 and BLB22, and the sense amplifier 233 is connected between bit lines BL23 and BLB23. In embodiments, the sense amplifiers 231, 332, and 233 may also be connected to, for example, the data bus 8 of FIG. 1, to read data from and write data to the second sub-array 200.

The array connecting circuit 300 includes a plurality of switches 301, 302, and 303 and connects bit lines of the first sub-array 100 to corresponding bit lines of the second sub-array 200 according to a copy signal COPY.

For example, the switch 301 connects the bit line BL11 and the bit line BLB21 according to the copy signal COPY.

FIGS. 3A to 3D illustrate a NOT operation of a semiconductor device according to an embodiment of the present disclosure.

In the illustrated example, the memory cell 111 initially stores "1".

During the NOT operation, both the first partial sum generating signal PSUM1 and the second partial sum generating signal PSUM2 are inactivated.

Figure 3A:
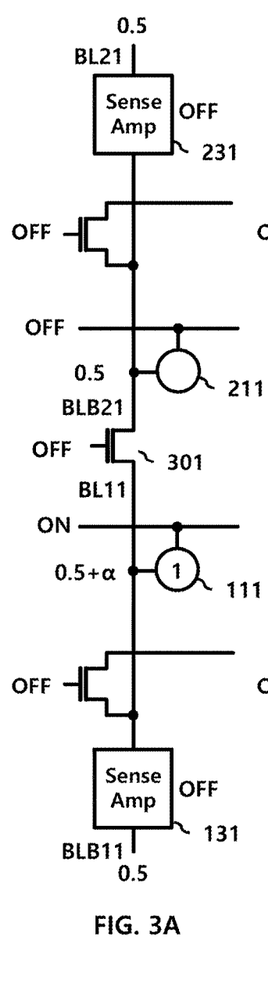
FIGS. 3A to 3D illustrate a NOT operation of a semiconductor device according to an embodiment of the present disclosure.

FIG. 3A shows a sensing step. The sensing step of FIG. 3A occurs after a first precharge operation that sets both the bit line BL11 and the bit line BLB11 connected to the sense amplifier 131 to 0.5 VDD.

When the word line WL1 is activated after the first precharge operation, the voltage of the bit line BL11 connected to the sense amplifier 131 rises to (0.5+a) VDD, and the voltage of the bit line BLB11 is maintained at 0.5 VDD.

At this time, the word line WL2, the switch 301 and the sense amplifier 231 are inactive or at turn-off state, and the bit line BL21 and the bit line BLB21 connected to the sense amplifier 231 have been precharged to 0.5 VDD.

Figure 3B:
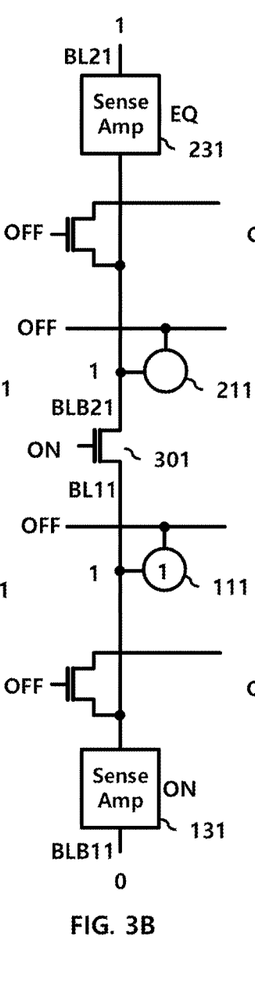

FIG. 3B illustrates a copying step performed after the sensing step.

The sense amplifier 131 is turned on to perform an amplification operation. The amplification operation may amplify a difference between the bit line BL11 and the bit line BLB11. Accordingly, the bit line BL11 is driven to VDD and the bit line BLB11 is driven to 0V.

At this time, the switch 301 is turned on to connect the bit line BL11 and the bit line BLB21, and accordingly, the voltage of the bit line BLB21 rises to VDD.

Also, the sense amplifier 231 performs an equalization operation that connects the bit line BL21 and the bit line BLB21.

Unlike a precharge operation, the equalization operation is a switching operation that simply connects the two bit lines BL21 and BLB21 connected to the sense amplifier 231. Accordingly, the voltage of the bit line BL21 also rises to VDD.

Figure 3C:
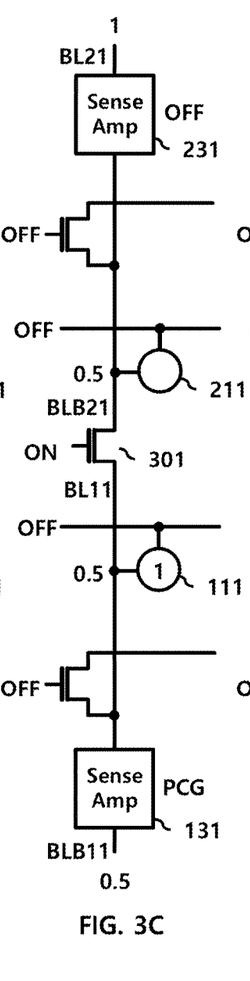

FIG. 3C illustrates a second precharging step performed after the copying step.

During the second precharging step, the sense amplifier 131 performs a precharge operation, the switch 301 is turned on, and the sense amplifier 231 is turned off.

Also, the word lines WL1 and WL2 are all inactivated.

Accordingly, while the voltage of the bit line BL21 is maintained at VDD, the bit line BL11, the bit line BLB11, and the bit line BLB21 are precharged to 0.5 VDD.

Figure 3D:
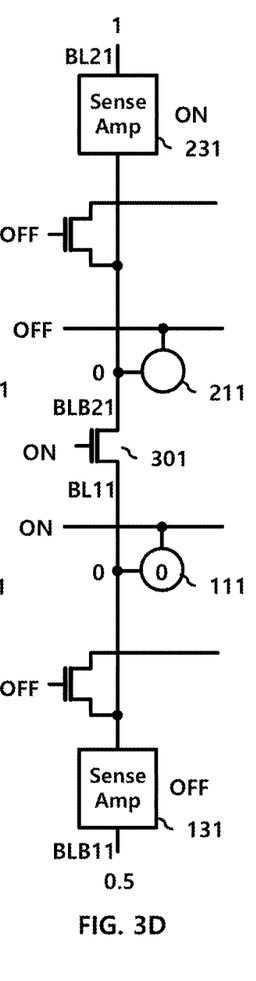

FIG. 3D illustrates an inversion step performed after the second precharging step.

During the inversion step, the sense amplifier 131 is turned off and the sense amplifier 231 is turned on to perform an amplification operation. At this time, the switch 301 is turned on and the word line WL1 is activated.

Accordingly, the voltage of the bit line BLB21 drops to 0V, and the bit line BL11 connected thereto also drops to 0V. Accordingly, data "0" is written in the memory cell 111.

As described above, since the word line included in the second cell array 210 is always inactive, the cell data stored in the second cell array 210 is not affected.

Figure 4:
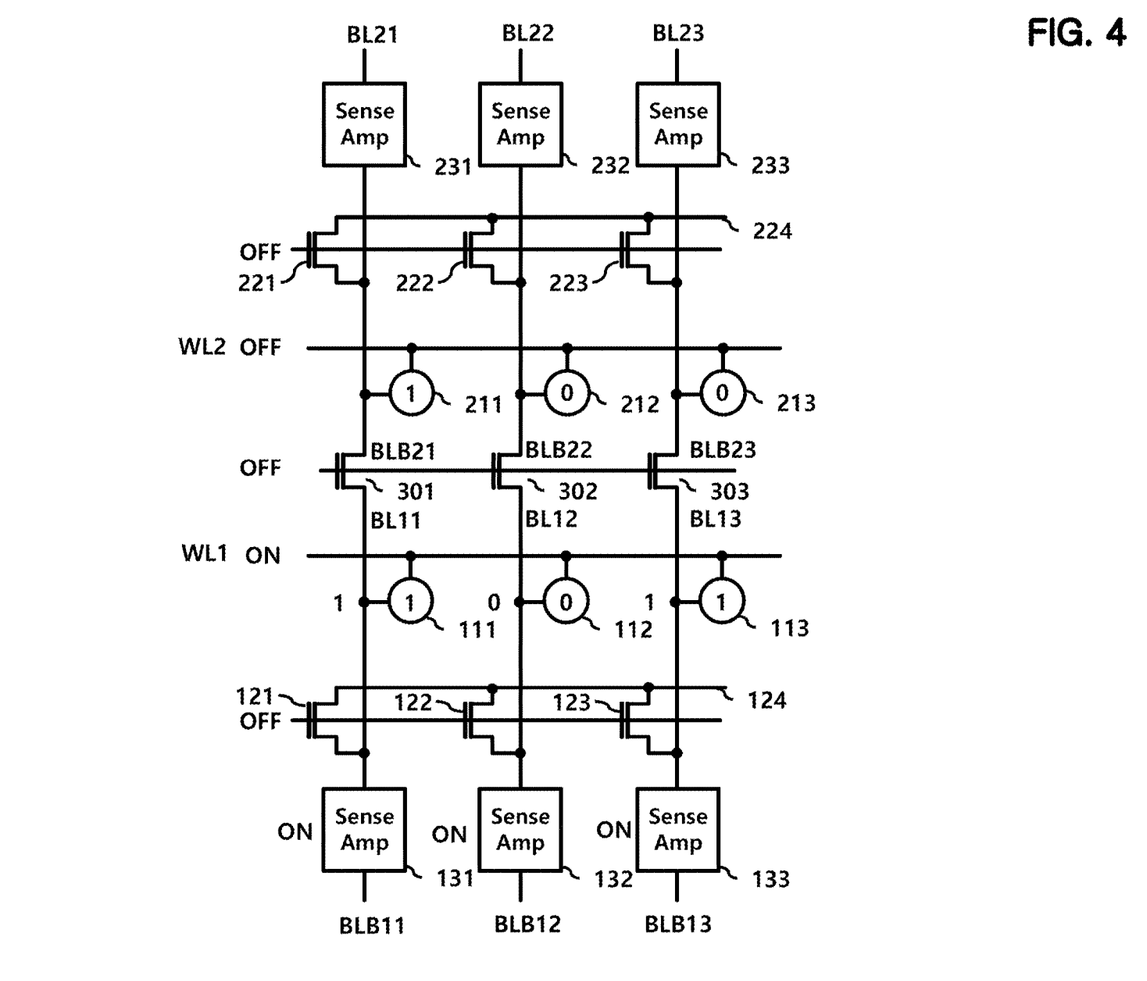
FIGS. 4 to 6 illustrate a partial sum operation performed by a semiconductor device according to an embodiment of the present disclosure.
Figure 5:
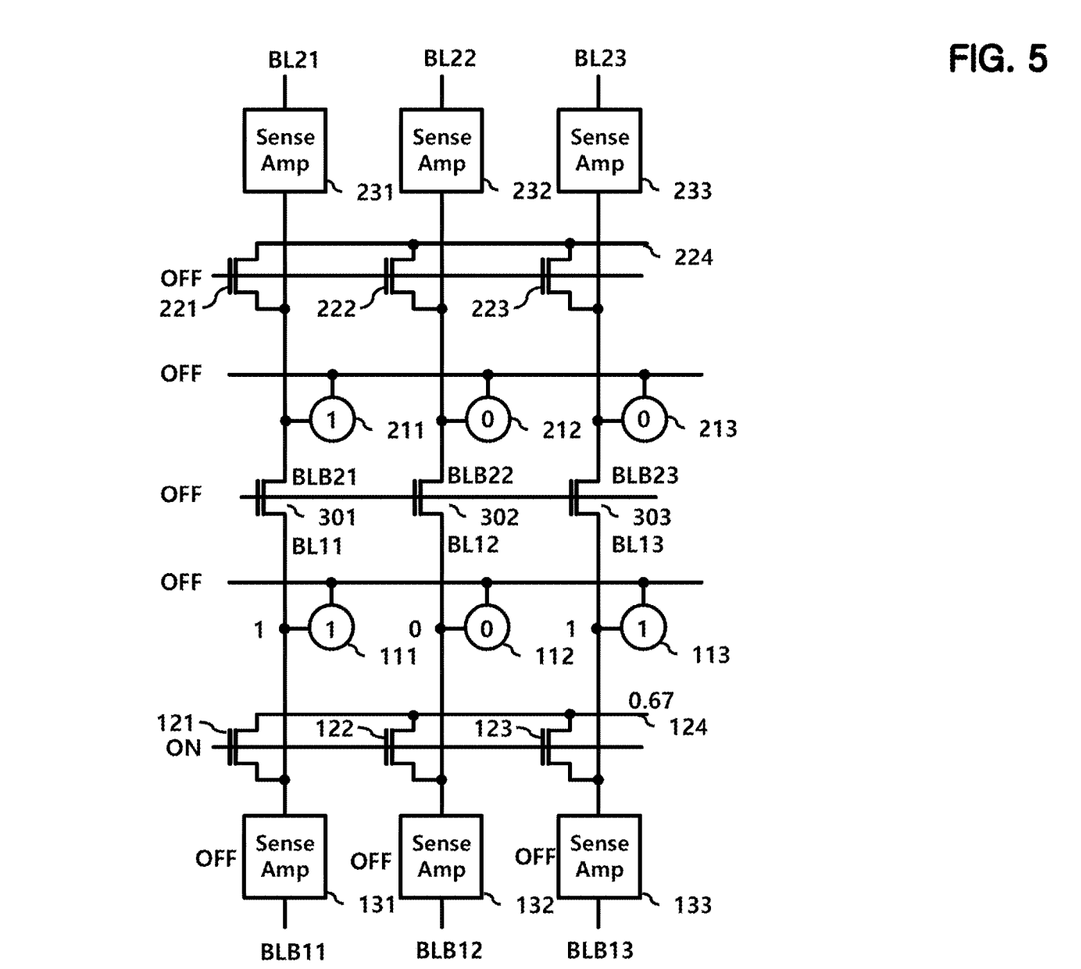
Figure 6:
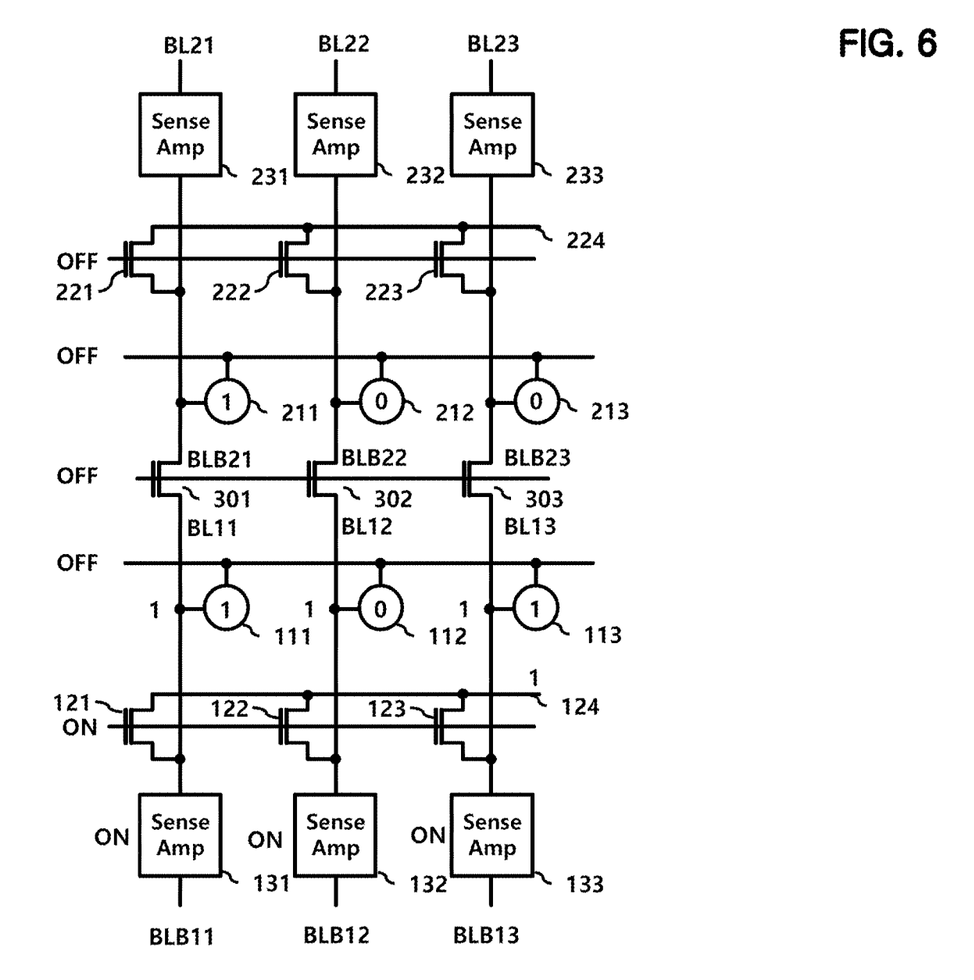

FIGS. 4 to 6 illustrate a partial sum operation of a semiconductor device according to an embodiment of the present disclosure.

FIG. 4 illustrates an activation step.

In the activation step, data of the plurality of memory cells 111, 112, and 113 connected to the word line WL1 are read to set voltages of the bit lines BL11, BL12, and BL13. In embodiments, the activation step comprises precharging the bit lines of the BL11, BL12, BL13, BLB11, BLB12, and BLB13, activating the word line WL1, and turning on the sense amps 131, 132, and 133 to perform an amplification operation that sets the voltages of the bit lines BL11, BL12, and BL13.

FIG. 4 illustrates a plurality of memory cells connected to one word line WL1, in another embodiment, the plurality of memory cells may be connected to different word lines.

In FIG. 4, data stored in the plurality of cells 111, 112, and 113 are "1", "0", and "1", respectively.

Accordingly, the voltage of the bit lines BL11 and BL13 is set to VDD, and the voltage of the bit line BL12 is set to 0V.

FIG. 5 illustrates a charge distribution step performed after the activation step.

In the charge distribution step, the first partial sum generating signal PSUM1 is activated to turn on the switches 121, 122, and 123 of the first partial sum generating circuit 120.

Accordingly, the bit lines BL11, BL12, and BL13 are commonly connected to the first common connection line 124 to distribute charges, and as a result, voltage of the bit lines BL11, BL12, and BL13 and the first common connection line 124 is set to 0.67 VDD, corresponding to an average of the respective voltages of the bit lines BL11, BL12, and BL13 before the first partial sum generating signal PSUM1 was activated. Hereinafter, this voltage may be referred to as a common voltage or a partial sum voltage.

FIG. 6 illustrates an evaluation step performed after the charge distribution step.

In the evaluation step, the bit line voltages BL11, BL12, and BL13 are amplified by activating the sense amplifiers 131, 132, and 133 after the charge distribution is completed between the bit lines BL11, BL12, and BL13.

After charge distribution, the voltages of the bit lines BL11, BL12, and BL13 are all 0.67 VDD, which is greater than 0.5 VDD.

Accordingly, when the sense amplifiers 131, 132, and 133 are activated, the voltages of the bit lines BL11, BL12, and BL13 are amplified to VDD. In an embodiment, a value according to the voltages of one or more of the bit lines BL11, BL12, and BL13 may then be read out of the memory array 2 without storing the value into any of the memory cells of the memory array 2. In another embodiment, the value according to the voltages of one or more of the bit lines BL11, BL12, and BL13 may be stored into one or more of the memory cells of the memory array 2 without being read out of the memory array 2. In another embodiment, the value according to the voltages of one or more of the bit lines BL11, BL12, and BL13 may be stored into one or more of the memory cells of the memory array 2 and read out of the memory array 2.

A partial sum operation for vector data having 3 or more bits can be processed using the partial result storage circuit 30.

For example, vector data having 9 bits may be divided into 3 groups, and 3 partial sum operations may be performed for the 3 groups, respectively. The 3 representative values which are results of the 3 partial sum operations may be stored in the partial result storage circuit 30. A final partial sum operation may be performed after storing the 3 representative values stored in the partial result storage circuit 30 into the memory cells, whose result corresponds to a result of a partial sum operation for the vector data having 9 bits. In an embodiment, the representative value may be regarded as a sampling of an analog partial sum as a digital value of 0 or 1.

As described above, a partial sum operation for vector data having more bits than a number of cells in a row of a memory array may be completed by performing a plurality of partial sum operations, which may be represented as a plurality of sub partial sum operations.

FIGS. 7A to 7E illustrate a partial sum operation using a result of a bitwise operation between two vector data.

Figure 7A:
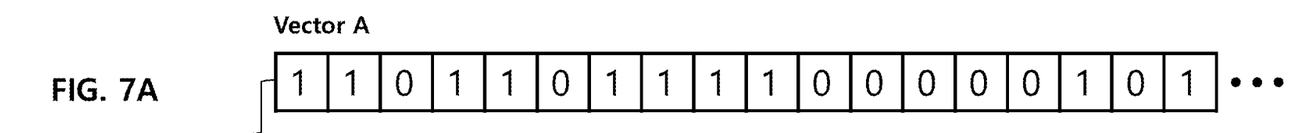
FIGS. 7A to 7E illustrate a partial sum operation performed by a semiconductor device according to an embodiment of the present disclosure.
Figure 7B:
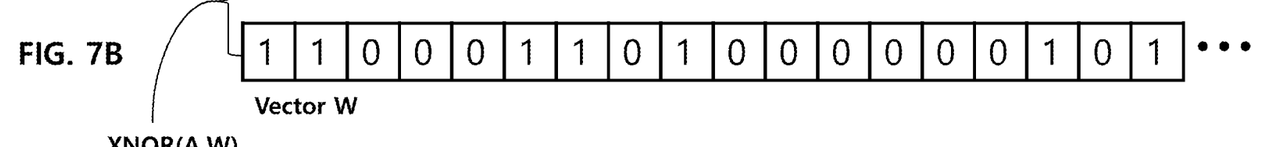

FIG. 7A represents a vector A and FIG. 7B represents a vector W.

The vector A and the vector W may be stored in different rows of the first cell array 110.

For example, when the number of memory cells included in one row is four, four elements of the vector A and four elements of the vector W may be stored in respective memory cells to process a bitwise operation.

Figure 7C:
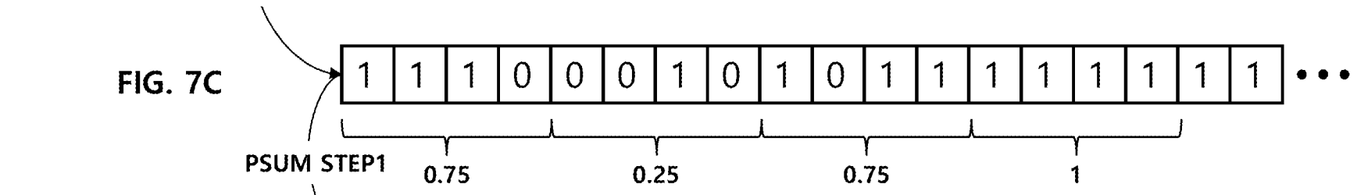

FIG. 7C shows a result of bitwise eXclusive Not Or (XNOR) operation on the vector A and the vector W.

The bitwise XNOR operation corresponds to the result of performing a bitwise NOT operation after performing a bitwise eXclusive OR (XOR) operation. Moreover, the bitwise XNOR operation may be represented with one or more bitwise AND operations, one or more bitwise NOT operations and a bitwise OR operation like the following Equation 1.

$$A \text{ XNOR } B = \text{NOT } (A \text{ XOR } B) = \\ [(\text{NOT } A) \text{ AND } (\text{NOT } B)] \text{ OR } (A \text{ AND } B) \quad \text{[Equation 1]}$$

The technique of performing the bitwise AND operation and the bitwise OR operation using the memory cell is the same as disclosed in the prior art " V. Seshadri et al., "Ambit: In-Memory Accelerator for Bulk Bitwise Operations Using Commodity DRAM Technology," 2017 50th Annual IEEE/ACM International Symposium on Microarchitecture (MICRO), Boston, Mass., USA, 2017, pp. 273-287.⸴, and a bitwise NOT operation may be performed as disclosed above with reference to FIGS. 3A to 3D, so the disclosure thereof will not be repeated.

Figure 7D:
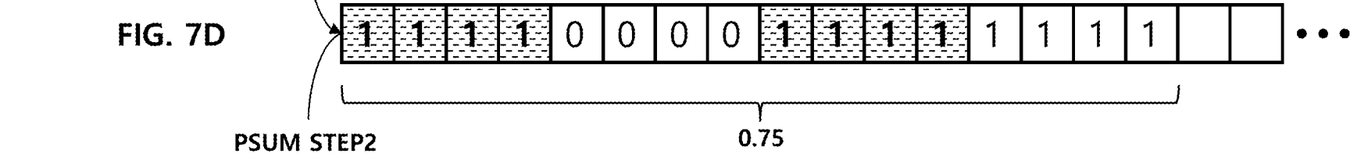
Figure 7E:
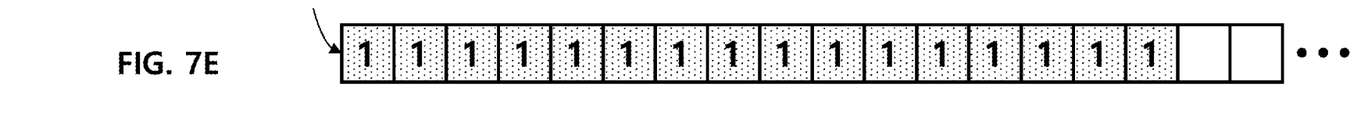

In FIGS. 7A to 7D, a partial sum operation is performed by a plurality of steps. As shown in FIGS. 7C and 7D, first step of a partial sum operation is performed for four elements. And as shown in FIGS. 7D and 7E, second step of a partial sum operation is performed for sixteen elements.

Figure 8:
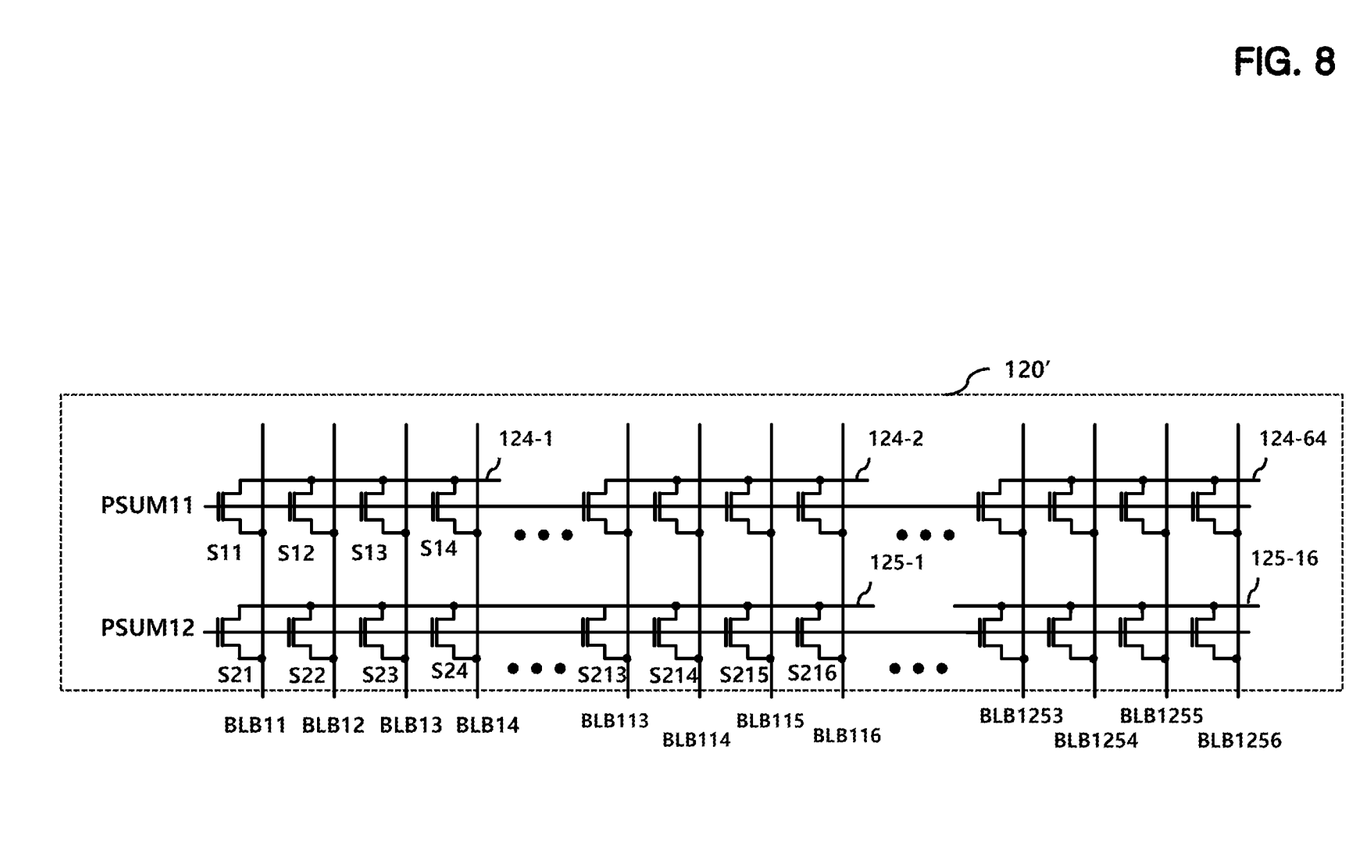
FIG. 8 illustrates a first partial sum generating circuit according to an embodiment of the present disclosure.

FIG. 8 illustrates a first partial sum generating circuit 120' according to an embodiment of the present disclosure.

The first partial sum generating circuit 120' of FIG. 8 may be used instead of the first partial sum generating circuit 120 of FIG. 2 to perform the operations illustrated by FIGS. 7A to 7E. A person of ordinary skill in the art would understand that the second partial sum generating circuit 220 of FIG. 2 may be changed similarly.

In the illustrative example of FIG. 8, there are 256 bit lines per row. The first partial sum generating circuit 120' includes first through 64th first step common connection lines 124-1~124-64 each being coupled with a respective group of four adjacent bit lines through switches. For example, the switches S11, S12, S13, and S14 commonly couples the bit lines BLB11, BLB12, BLB13, and BLB14 to the first step common connection line 124-1 according to a first step partial sum generating signal PSUM11.

The first partial sum generating circuit 120' further includes first through 16th second step common connection lines 125-1 to 125-16 each being coupled with a respective group of 16 adjacent bit lines through switches. For example. The switches S21 to S216 commonly couples the bit lines BLB11 to BLB116 to the second step common connection line 125-1 according to a second step partial sum generating signal PSUM12.

During the first step of a partial sum operation, the first step partial sum generating signal PSUM11 is enabled and the second step partial sum generating signal PSUM12 is disabled. During the second step of a partial sum operation, the second step partial sum generating signal PSUM12 is enabled and the first step partial sum generating signal PSUM11 is disabled After the first step of a partial sum operation, a representative value for four bit lines is stored in the memory cells coupled to the four bit lines as shown in FIG. 7D. And after the second step of a partial sum operation, a representative value for 16 bit lines is stored in the memory cells coupled to the 16 bit lines as shown in FIG. 7E.

FIG. 7E indicates that a result of the partial sum operation for 16 elements is "1".

Further additional partial sum operations may be performed according to the number of elements in the vector data.

Although various embodiments have been illustrated and described, various changes and modifications may be made to the described embodiments without departing from the spirit and scope of the invention as defined by the following claims.

What is claimed is:

1. A semiconductor device comprising:
a cell circuit including a plurality of memory arrays; and
a control circuit configured to control the cell circuit,
wherein a memory array of the plurality of memory arrays includes:
a plurality of sub-arrays having a first sub-array and a second sub array; and
an array connecting circuit configured to connect bit lines of the first sub-array to corresponding bit lines of the second sub-array, respectively, according to a copy signal,
where each of the plurality of sub-arrays includes:
a plurality of bit lines;
a plurality of word lines;
a cell array including a plurality of rows respectively corresponding to the plurality of word lines, each row comprising a plurality of memory cells respectively connected between the plurality of bit lines and the word line corresponding to that row; and
a plurality of sense amplifiers connected to the plurality of bit lines, and
wherein the semiconductor device performs a NOT operation on data of a first memory cell included in the first sub-array by:
reading the data of the first memory cell onto a first bit line connected to the first memory cell using a first sense amplifier, and
connecting the first bit line to a second bit line of the second sub-array using the array connecting circuit while the data of the first cell is present on the first bit line.

2. The semiconductor device of claim 1, wherein performing the NOT operation further comprises:
connecting the second bit line to a third bit line by performing an equalization operation using a second sense amplifier;
deactivating the second sense amplifier after performing the equalization operation; and
performing a precharge operation on the first and second bit lines using the first sense amplifier while the second sense amplifier is deactivated.

3. The semiconductor device of claim 2, wherein performing the NOT operation further comprises:
deactivating the first sense amplifier after performing the precharge operation; and
performing a write operation of an inverted value of the third bit line using the second sense amplifier.

4. The semiconductor device of claim 1, wherein at least one of the plurality of sub-arrays includes a partial sum generating circuit including a plurality of switches connecting the plurality of bit lines to a common connection line according to a partial sum generating signal.

5. The semiconductor device of claim 4, wherein the plurality of switches are turned on after a plurality of memory cells connected to the plurality of bit lines are read, and then a voltage of the plurality of bit lines is set to a partial sum voltage corresponding to a charge distribution.

6. The semiconductor device of claim 5, wherein the control circuit includes a partial result storage circuit configured to store a representative value corresponding to the partial sum voltage.

7. The semiconductor device of claim 6, wherein the control circuit further includes:
   a mapping circuit configured to provide data stored in a write buffer as row data or column data to a row of a cell array of the plurality of sub-arrays;
   a path setting circuit configured to provide data of the write buffer or the mapping circuit to a data bus; and
   a processing control circuit configured to control the mapping circuit and the path setting circuit during a processing operation.

8. The semiconductor device of claim 7, wherein the control circuit further includes:
   an interface circuit configured to receive a command, an address, and data;
   a command address decoder connected to the interface circuit and configured to decode the command and the address; and
   a read buffer configured to provide read data to the interface circuit,
   wherein the write buffer stores write data provided from the interface circuit and the data bus transfers data in the control circuit.

9. An operation method of a semiconductor device comprising:
   reading data from a first memory cell of a first sub-array onto a first bit line connected to the first memory cell;
   connecting the first bit line to a second bit line of a second sub-array;
   performing an equalization operation using a second sense amplifier to set a value of a third bit line according to a value of the data on the second bit line;
   performing a precharge operation using the first sense amplifier of at least the second bit line while the second sense amplifier is turned off; and
   performing a write operation according to the value of the third bit line using the second sense amplifier while the first sense amplifier is turned off.

10. An operation method of a semiconductor device comprising:
    reading data from a first memory cell of a first sub-array onto a first bit line connected to the first memory cell;
    connecting the first bit line to a second bit line of a second sub-array;
    performing an equalization operation using a second sense amplifier to set a value of a third bit line according to a value of the data on the second bit line;
    performing a precharge operation using the first sense amplifier of at least the second bit line while the second sense amplifier is turned off;
    performing a write operation according to the value of the third bit line using the second sense amplifier while the first sense amplifier is turned off;
    performing a read operation on a plurality of memory cells of the first sub-array;
    connecting a plurality of bit lines connected to the plurality of memory cells in common; and
    amplifying a voltage of the plurality of bit lines by activating a plurality of sense amplifiers connected to the plurality of bit lines.

11. The operation method of claim 10, further comprising storing representative values corresponding to voltages of the plurality of bit lines.

* * * * *